(12) United States Patent
Liu et al.

(10) Patent No.: US 9,318,431 B2
(45) Date of Patent: Apr. 19, 2016

(54) INTEGRATED CIRCUIT HAVING A MOM CAPACITOR AND METHOD OF MAKING SAME

(75) Inventors: Chi-Wen Liu, Hsin-Chu (TW); Chao-Hsiung Wang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 366 days.

(21) Appl. No.: 13/289,666

(22) Filed: Nov. 4, 2011

(65) Prior Publication Data

US 2013/0113073 A1   May 9, 2013

(51) Int. Cl.
| | |
|---|---|
| *H01L 23/522* | (2006.01) |
| *H01L 29/94* | (2006.01) |
| *H01L 29/40* | (2006.01) |
| *H01L 49/02* | (2006.01) |
| *H01L 27/12* | (2006.01) |

(52) U.S. Cl.
CPC ............ *H01L 23/5223* (2013.01); *H01L 28/60* (2013.01); *H01L 28/90* (2013.01); *H01L 29/40* (2013.01); *H01L 29/94* (2013.01); *H01L 27/1203* (2013.01); *H01L 2924/0002* (2013.01)

(58) Field of Classification Search
CPC ..... H01L 23/5223; H01L 28/40; H01L 28/90; H01L 28/60; H01L 21/76
USPC ............................ 438/381, 153; 257/532, 758
See application file for complete search history.

(56) References Cited

U.S. PATENT DOCUMENTS

| | | | |
|---|---|---|---|
| 7,312,492 B2 | 12/2007 | Gruning-Von Schwerin | |
| 2005/0253267 A1* | 11/2005 | Takao | 257/758 |
| 2006/0006446 A1* | 1/2006 | Schwerin | 257/308 |
| 2007/0080387 A1* | 4/2007 | Liu | H01L 28/82 257/303 |
| 2009/0315092 A1* | 12/2009 | Mikasa | 257/303 |
| 2010/0078695 A1 | 4/2010 | Law et al. | |
| 2010/0123214 A1* | 5/2010 | Chen | H01L 23/5223 257/532 |
| 2010/0279497 A1* | 11/2010 | Lee | H01L 29/78 438/589 |
| 2011/0068405 A1 | 3/2011 | Yuan et al. | |
| 2011/0095372 A1 | 4/2011 | Yuan et al. | |

(Continued)

FOREIGN PATENT DOCUMENTS

| | | | |
|---|---|---|---|
| CN | 102446974 | 5/2012 | |
| CN | 103094362 | * 5/2013 | ............. H01L 28/92 |

(Continued)

OTHER PUBLICATIONS

Title: A Low-Voltage Lateral SJ-FINFET with Deep-Trench p-Drift Region Author: Yoo, A.; Samsung Electron Co., Ltd., Giheung, South Korea; Onish, Y. ; Xu, E. ; Ng. J.C.W. Date of Publication: Jul. 10, 2009.*

(Continued)

*Primary Examiner* — Eva Y Montalvo
*Assistant Examiner* — Nga Doan
(74) *Attorney, Agent, or Firm* — Slater & Matsil, L.L.P.

(57) ABSTRACT

An integrated circuit can include a MOM capacitor formed simultaneously with other devices, such as finFETs. A dielectric layer formed on a substrate has a first semiconductor fin therein and a second semiconductor fin therein. Respective top portions of the fins are removed to form respective recesses in the dielectric layer. First and second electrodes are formed in the recesses. The first and second electrodes and the interjacent dielectric layer form a MOM capacitor.

19 Claims, 11 Drawing Sheets

(56) References Cited

U.S. PATENT DOCUMENTS

2011/0143509 A1* 6/2011 Fujimoto ............... 438/270
2012/0091538 A1* 4/2012 Lin et al. ............... 257/401

FOREIGN PATENT DOCUMENTS

| JP | 02-090561 | 3/1990 |
| KR | 20110033039 A | 3/2011 |
| KR | 20110049679 A | 5/2011 |

OTHER PUBLICATIONS

Chinese Office Action received in Application No. 10-2012-0000660, Applicant: Taiwan Semiconductor Manufacturing Company, Ltd., mailed May 24, 2013, 5 pages.

\* cited by examiner

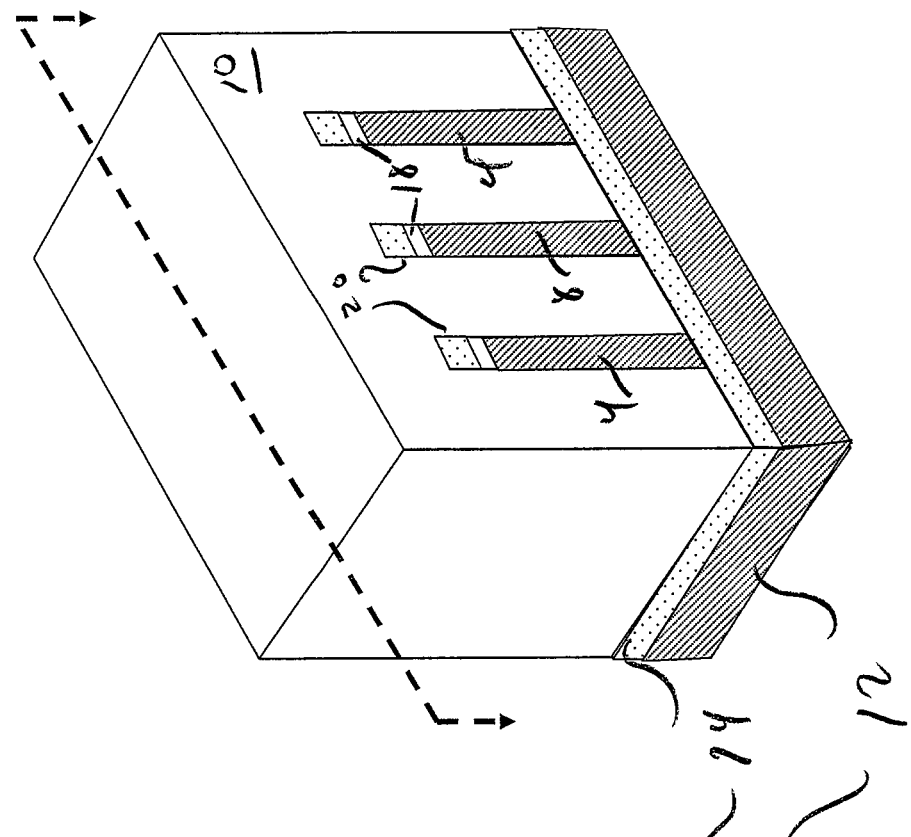
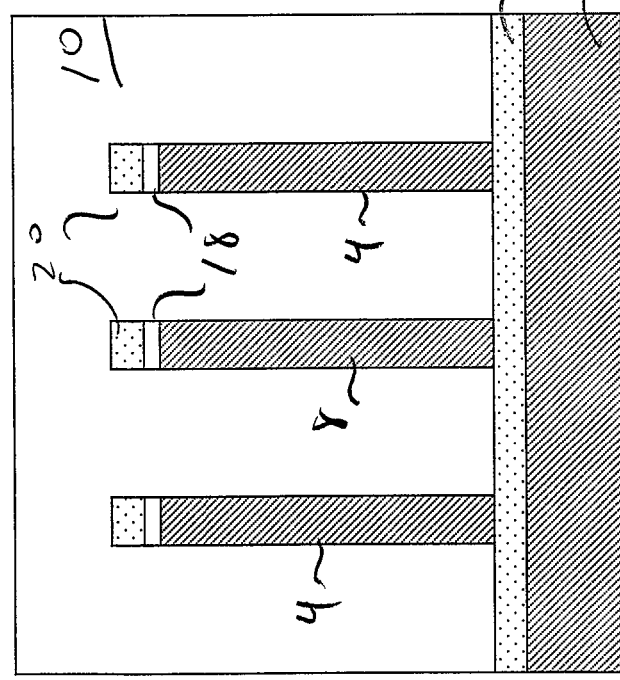
FIG. 4a
FIG. 4b

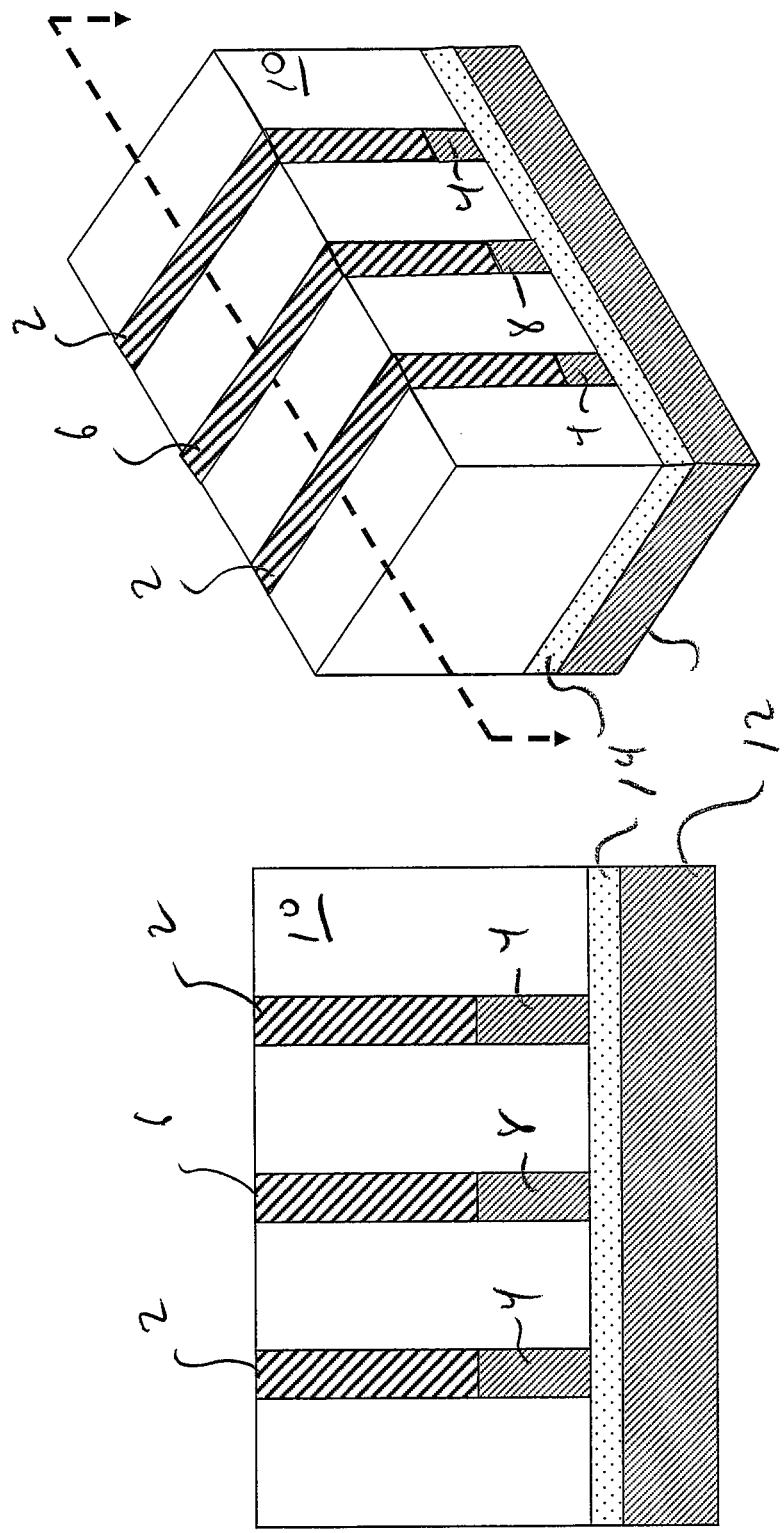

US 9,318,431 B2

INTEGRATED CIRCUIT HAVING A MOM CAPACITOR AND METHOD OF MAKING SAME

BACKGROUND

Fin field effect transistor (FinFET) devices represent a next step in the continuous evolvement of semiconductor transistor technology. As contrasted to conventional planar transistors, finFET devices raise numerous issues relating to integration with other circuit devices in order to improve device performance and surface area utilization efficiency.

BRIEF DESCRIPTION OF THE DRAWINGS

For a more complete understanding of the present invention, and the advantages thereof, reference is now made to the following descriptions taken in conjunction with the accompanying drawings, in which:

FIGS. 2a through 7b illustrate steps in the manufacture of the structure illustrated in FIGS. 1a and 1b;

FIGS. 8a through 9b illustrates steps in the manufacture of a second illustrative embodiment MOM capacitor.

DETAILED DESCRIPTION OF ILLUSTRATIVE EMBODIMENTS

Figures 1A, 1B, 1C:
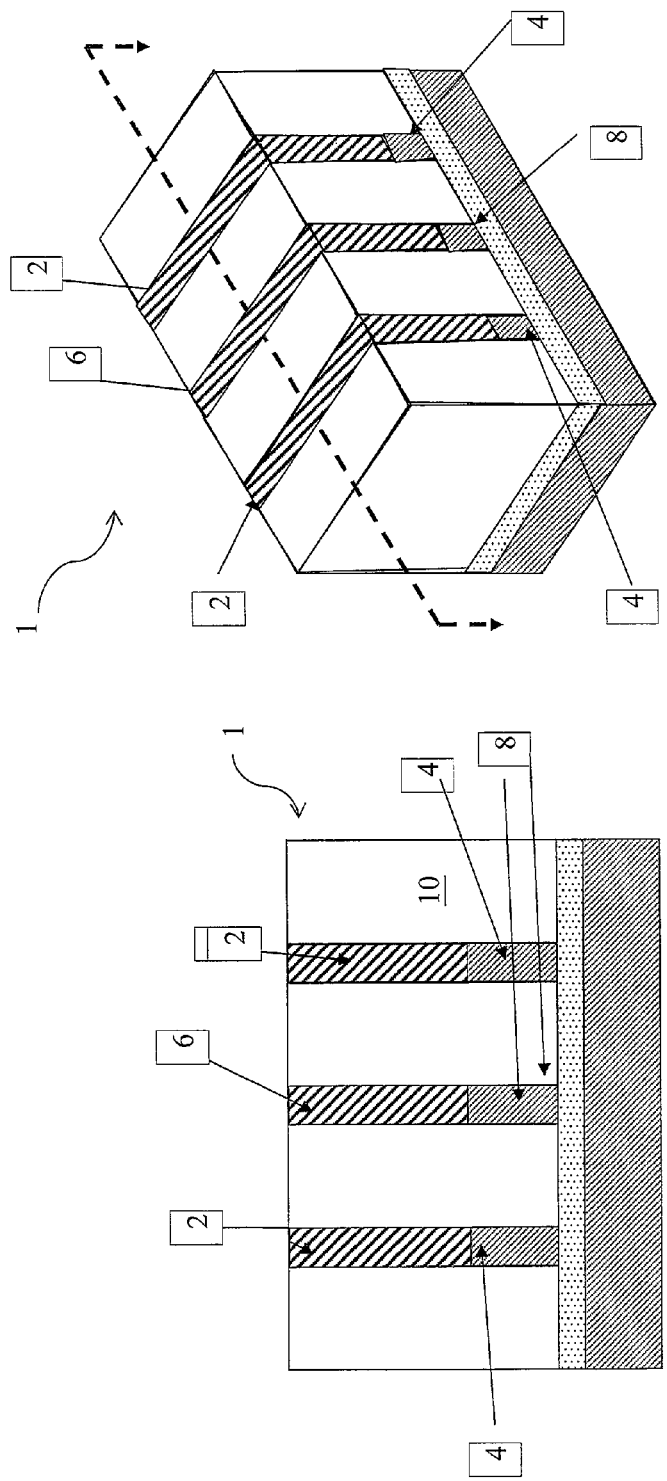
FIGS. 1a, 1b, and 1c illustrate in perspective view, cross-sectional view, and top view, respectively, an illustrative embodiment MOM capacitor structure.

FIG. 1a represents in perspective view a first embodiment metal oxide metal (MOM) capacitor structure 1 formed using fin field effect transistor (finFET) technology and structures. FIG. 1b represents MOM capacitor 1 in cross-sectional view through the line indicated in FIG. 1a.

MOM capacitor 1 includes a first electrode 2 and a second electrode 6. First electrode 2 is formed atop a first fin structure 4 and second electrode 6 is formed atop a second fin structure 8. Dielectric material 10, providing the capacitor dielectric function, is formed between first electrode 2 and second electrode 6. In this way a MOM capacitor is formed of first electrode 2, dielectric material 10, and second electrode 6. In the illustrated embodiment, MOM capacitor 1 has two first electrodes 2 formed atop two respective first fin structures 4. This is a design choice, and one skilled in the art will recognize a number of alternative embodiments, including two or more first electrodes, two or more second electrodes, a single first electrode, and single second electrode, and the like, all of which fall within the contemplated scope of the present disclosure.

First fin structure 4 and second fin structure 8 are formed atop a major surface of semiconductor-on-insulator (SOI) substrate in the illustrated embodiment. The substrate includes a bulk layer 12 (see FIGS. 2a and 2b), such as silicon or other semiconductor material, on which is formed SOI dielectric layer 14 (see FIGS. 2a and 2b). SOI dielectric layer 14 may be silicon oxide, for example. In other embodiments, other materials may be used for bulk layer 12 and SOI dielectric layer 14. Electrical contacts 3, 5 are formed contacting first electrode 2 and second electrode 6, respectively. In some embodiments, contacts 3, 5 are formed overlying electrodes 2, 6 and make electrical contact to the respective electrodes by way of vias 7, 9 respectively, as is known in the art.

Figure 11:
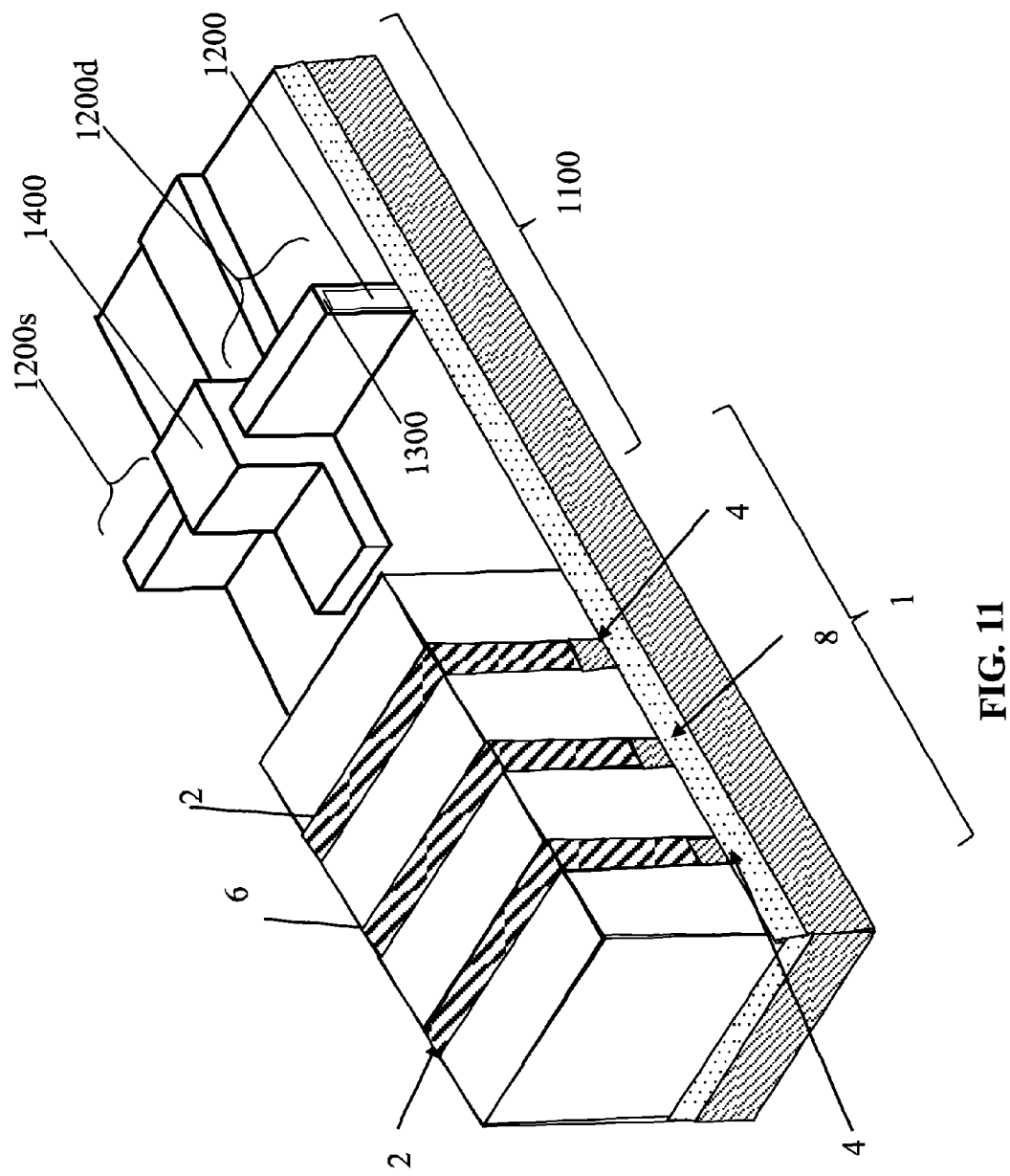
FIG. 11 illustrates in perspective view an illustrative embodiment MOM capacitor structure and an illustrative embodiment finFET device.

The MOM structure illustrated in FIGS. 1a and 1b provides the advantage that the structure may be formed simultaneously with a finFET device, without the need for additional manufacturing steps. This is illustrated in the example of FIG. 11 where an illustrative embodiment finFET device 1100 is formed simultaneously with the MOM capacitor structure 1. One skilled in the art will recognize that counter-part structures to fins 4 and 8 (e.g. a counter-part third semiconductor fin 1200) may be formed simultaneously with fins 4 and 8, doped to have a source and drain formed therein (e.g. source region 1200s and drain region 1200d of third semiconductor fin 1200), and covered with a gate oxide (e.g. gate oxide 1300 covering third semiconductor fin 1200) and a gate electrode (e.g. gate electrode 1400 covering a portion of the third semiconductor fin 1200). This may reduce manufacturing costs and complexity and increase manufacturing yield. Another advantageous feature of the illustrated embodiment is that the MOM capacitor structure 1, by utilizing thin fin structures 4 and 8, is compact and provides for efficient space utilization.

Figures 2A, 2B:
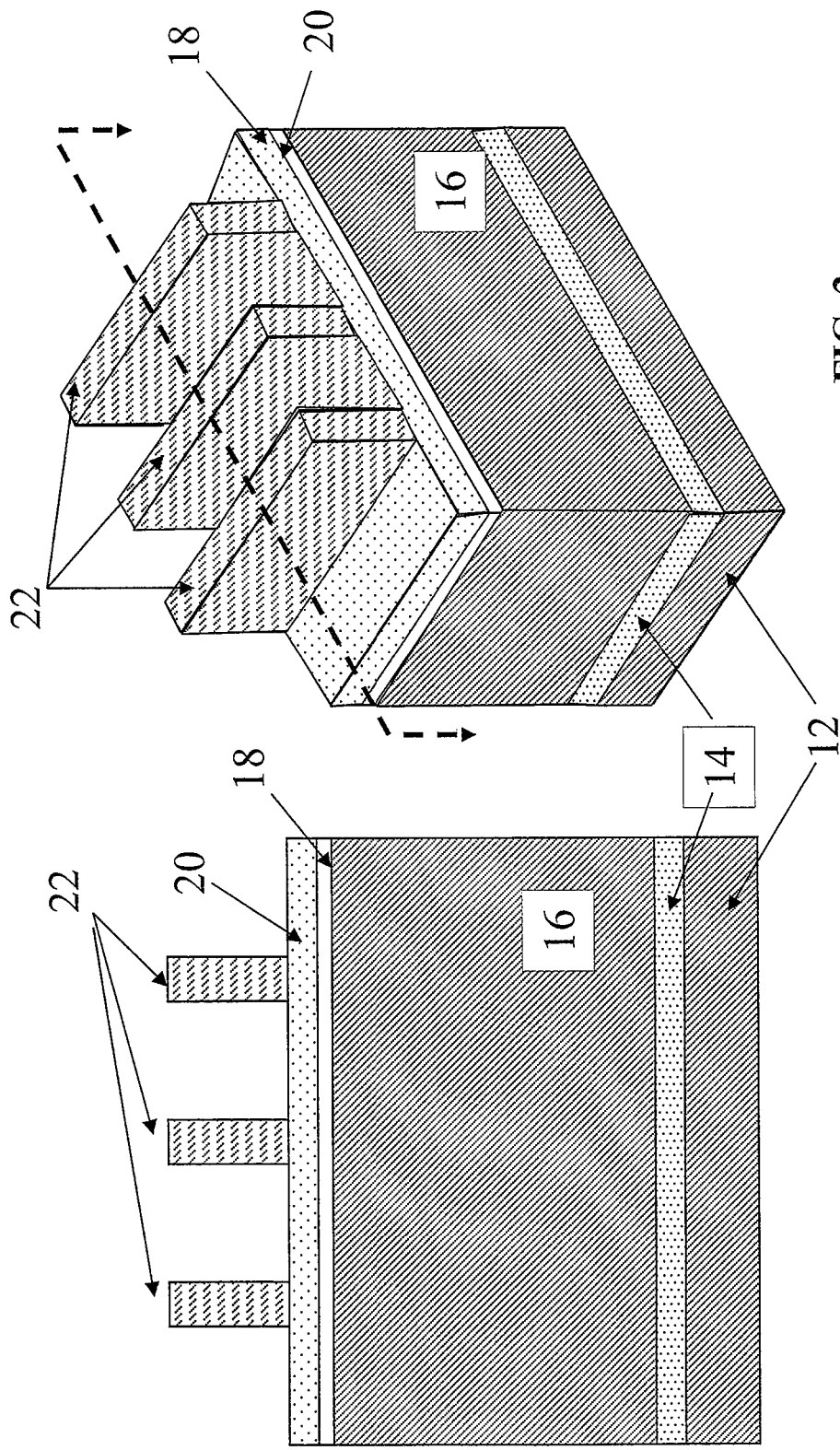

An illustrative embodiment process for manufacturing MOM capacitor 1 will now be provide with reference to FIGS. 2a through 7b. FIG. 2a illustrates in perspective view and FIG. 2b illustrates in cross-sectional view an intermediate phase in the manufacture of MOM capacitor 1. An SOI substrate comprising bulk layer 12, SOI dielectric layer 14, and semiconductor layer 16 is provided. The details of an SOI substrate and the manufacture thereof are well known, and hence are not included herein for the sake of brevity and clarity. As will be apparent to those skilled in the art, semiconductor layer 16 is the layer in which will be formed, e.g., first fin structure 4 and second fin structure 8, as illustrated in FIGS. 1a and 1b, and as discussed further in the following description.

Pad oxide 18 and hard mask 20 are formed atop semiconductor layer 16 using known techniques. Pad oxide 18 may be, for instance, a thermally grown or chemical vapor deposition (CVD) deposited silicon oxide layer. Hard mask 20 may be, as an example, a silicon nitride layer. Other materials may be used as well. Also illustrated in FIGS. 2a and 2b is photo-sensitive layer 22. In the stage of manufacturing illustrated in FIG. 2, photo-sensitive layer 22 has been patterned using known mask and photolithography techniques. Photo-sensitive layer may be a photo-sensitive polymer, such as a photoresist material typically employed in the manufacture of integrated circuits.

Figures 3A, 3B:
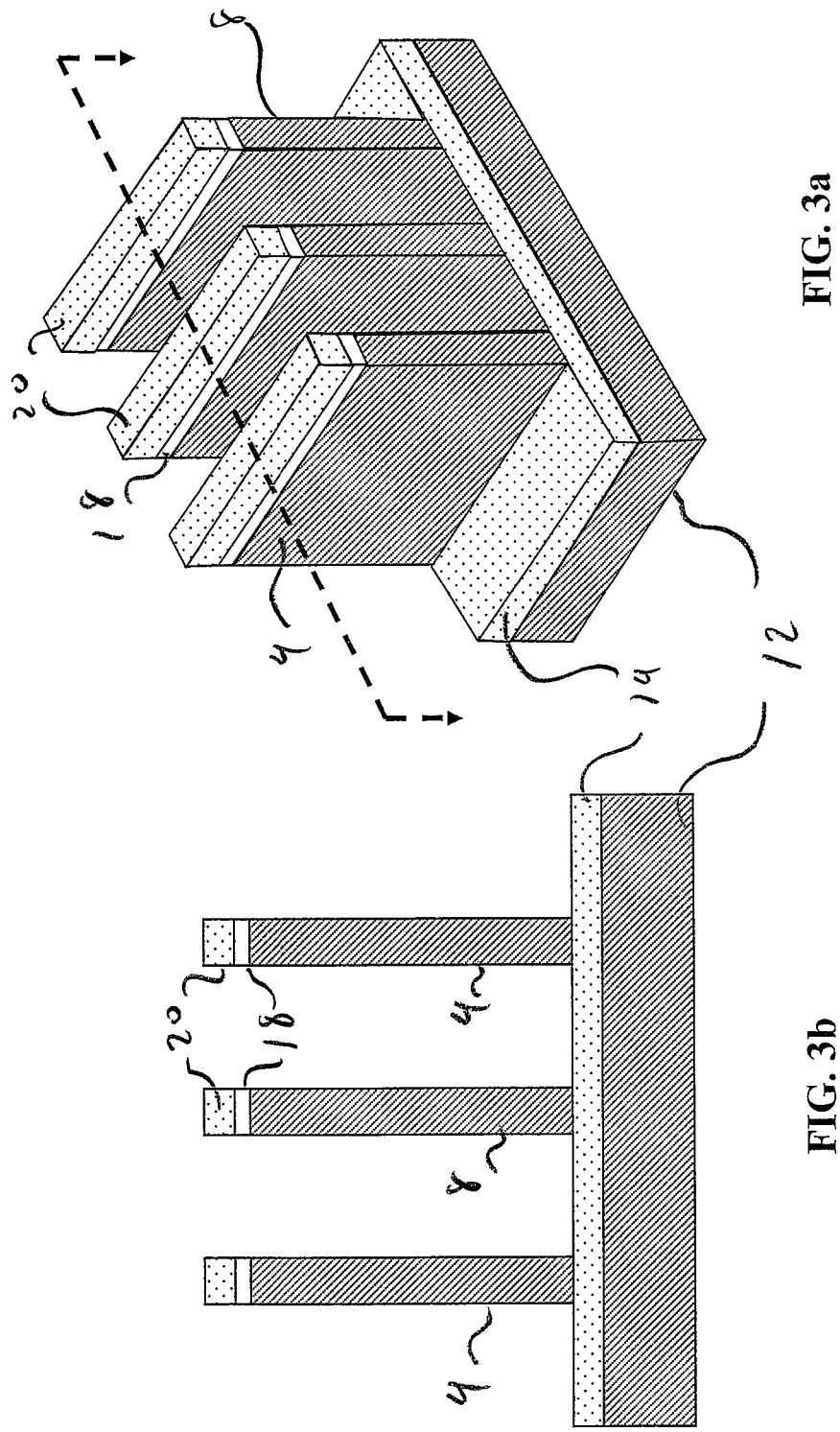

The purpose of hard mask 20 and pad oxide 18 is to provide for the faithful reproduction of a pattern from patterned photo-sensitive layer 22 into underlying semiconductor layer 16, while at the same time protecting the upper surface of semiconductor layer 16 during the etch process. The result of this reproduction is the formation of fin structures 4 and 8, as illustrated in FIG. 3 (which includes FIGS. 3a and 3b). As shown, the pattern of photo-sensitive layer 22 is transferred to semiconductor layer 16 using well known etch process, such as an anisotropic plasma etch process for form fin structures in semiconductor layer 16. One skilled in the art will recognize numerous processes that are sufficient for the etching of semiconductor layer 16 using routine experimentation; hence the details of the etch process are not discussed herein.

It should be noted that the process of etching a pattern into semiconductor layer 16 is also employed in the formation of finFET devices. Hence, it is contemplated that in some embodiments, semiconductor layer 16 will be patterned in a first region to form fin structures for a resulting MOM capacitor (such as illustrated in FIG. 3), while simultaneously, semiconductor layer 16 will be patterned in a second region to form fin structures for a resulting finFET device (not shown in FIG. 3). Likewise, unless specifically excluded herein, each of the following process steps can be performed simultaneously with process steps to concurrently form a finFET device. Note that in the case illustrated in FIG. 3 the etching process completely removes photo-sensitive layer 22. Alternatively, remaining portions of photo-sensitive layer 22 can be removed by ashing, an ozone plasma, or other known techniques for removing residual photo-sensitive materials. In other embodiments, residual photo-sensitive material can be removed in a subsequent processing step.

Dielectric material 10 is next formed, as illustrated in FIG. 4 (which includes FIG. 4a and FIG. 4b). In an intermediate stage of manufacture, as shown in FIG. 4, dielectric material 10 completely surrounds the fin structures 4 and 8. Dielectric material 10 may be a silicon oxide material formed by CVD, PVD, and the like, or a high-k material formed by CVD, PVD, ALD, and the like. In some embodiments, dielectric material 10 may be referred to as shallow trench isolation (STI) dielectric, in reference to the known materials and process steps for forming STI dielectrics. In embodiments wherein fin structures (such as finFETs and MOM capacitor 1) are formed simultaneously with planar devices (such as planar transistors, for instance), dielectric material 10 may be formed simultaneously with shallow trench isolation for the planar devices.

Figure 5A:
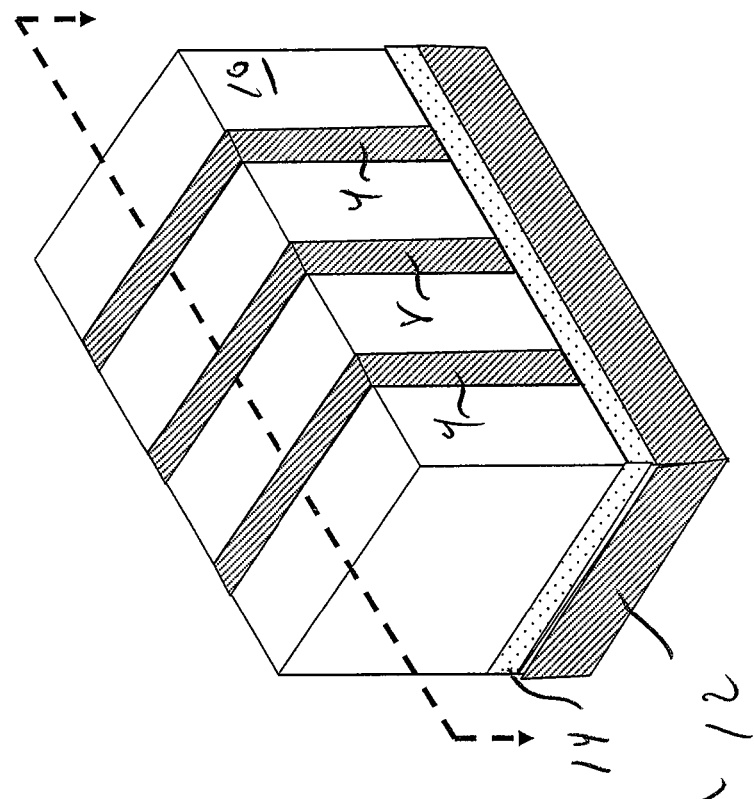
Figure 5B:
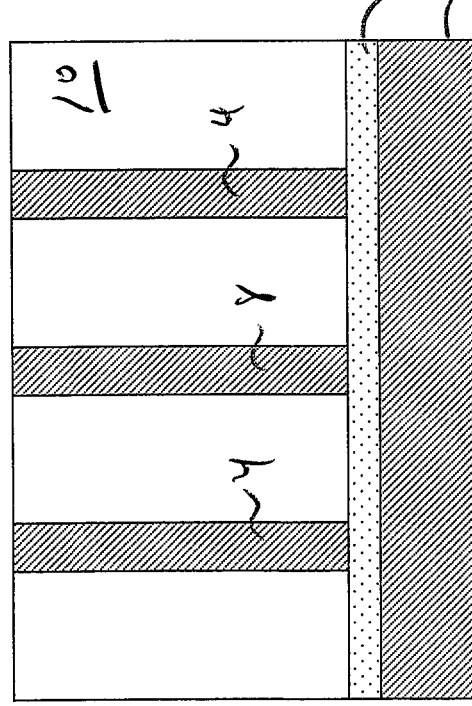

FIG. 5a illustrates in perspective view and FIG. 5b illustrates in cross-sectional view the results of a planarizing process performed on the structure. In particular, dielectric material 10 is planarized and its top surface brought level to the top surface of the fin structures 4, 8. In this process, any residual photo-sensitive layer 22, as well as any remaining portions of hard mask 20 and pad oxide 18 may also be removed. In some embodiments, dielectric material 10 is planarized using a chemical mechanical polish (CMP) process. In other embodiments, dielectric material 10 may be planarized using an etch-back process, as will be apparent to those skilled in the art. As illustrated in FIG. 5, the top surfaces of fin structures 4, 8 are now exposed.

Figure 6A:
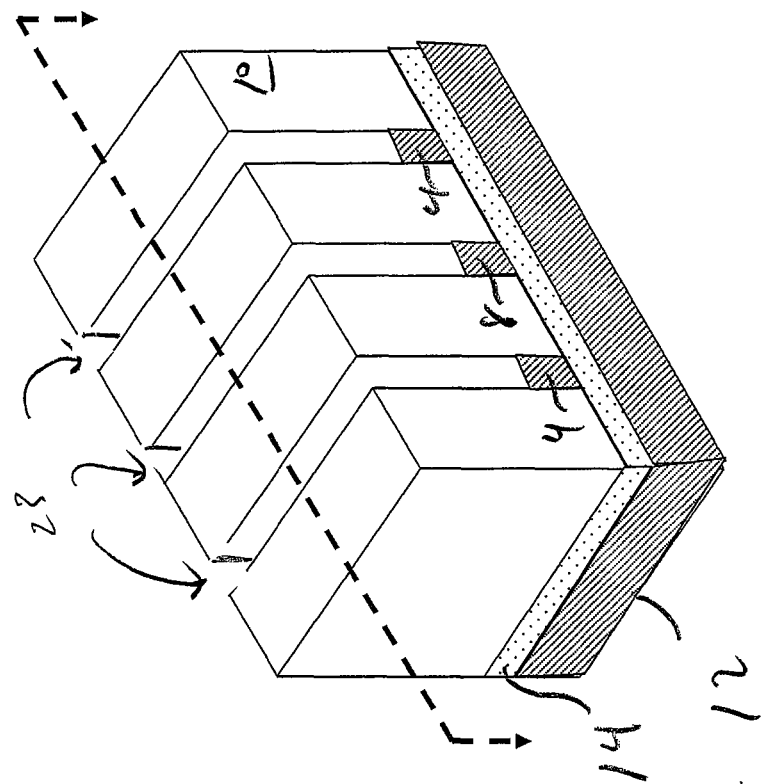
Figure 6B:
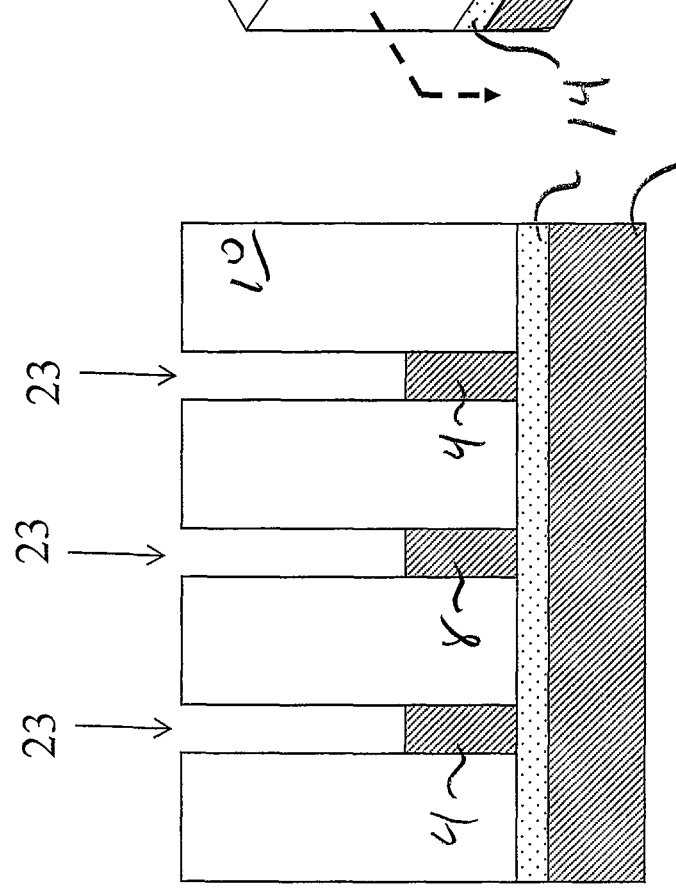

In a next process step, fin structures 4, 8 are recessed back, as illustrated in FIGS. 6a and 6b, which illustrate the resulting structure in perspective view and cross-sectional view, respectively. As an example, fin structures 4, 8 are originally formed having a height (i.e. extending above the surface of SOI dielectric layer) of from about 600 nm to about 1200 nm. After the recess process, fin structures 4, 8 have a height of from about 300 nm to about 500 nm. This recess process can be performed in a variety of ways. In an illustrative embodiment, fin structures 4, 8 are recessed back by, for instance, a dry etch process. The etching process may be performed under a pressure of from about 1 mTorr to about 1000 mTorr, a power of from about 50 W to about 1000 W, a bias voltage of from about 20 V to about 500 V, and at a temperature of from about 40° C. to about 60° C., using, e.g., HBr and/or $Cl_2$ as etch gases.

First electrode 2 and second electrode 6 are next formed, as illustrated in perspective view by FIG. 7a and cross-sectional view by FIG. 7b. As shown, the recesses 23 in dielectric material 10 that result from the etch process on fin structure 4, 8 are filled with a conductive material for forming first electrode 2 and second electrode 6. The electrodes may be formed of a suitable conductive material, such as aluminum, copper, tungsten, titanium, a metal silicide, a conductive ceramic, doped silicon, or the like. In some embodiments, one or more barrier and/or seed layers may be formed along the bottom and sidewalls of recesses 23 prior to forming the conductive electrode material. For instance a barrier layer of one or more sub-layers of titanium and titanium nitride may be formed in recesses 23 prior to forming, e.g., a tungsten conductive electrode. Alternatively, electrodes could be formed of highly doped and silicided polysilicon material. In yet other embodiments, a thin seed layer could be formed in recesses 23 prior to forming the electrodes using an electroplating or electroless plating technique.

Other techniques for forming electrodes 2 and 6 will be apparent to those skilled in the art. These include but are not limited to chemical or vapor deposition, sputter deposition, plating, and the like. As shown in FIG. 7, first electrode 2 and second electrode 6 have top surfaces that are level with, or co-terminus with, the top of dielectric material 10. This may be accomplished by careful control of the deposition process. Alternatively, conductive material could be formed so as to overlie the top surface of dielectric material 10, followed by a CMP (or etch back) process to planarize the conductive material and bring it level with dielectric material 10, thus forming electrodes 2 and 6. As noted previously, additional process steps, such as the formation of contacts to electrodes 2, 6 may be performed to electrically couple MOM capacitor 1 to other circuit elements, to gang multiple first electrodes 2, or second electrodes 6, together, and the like.

Figure 8A:
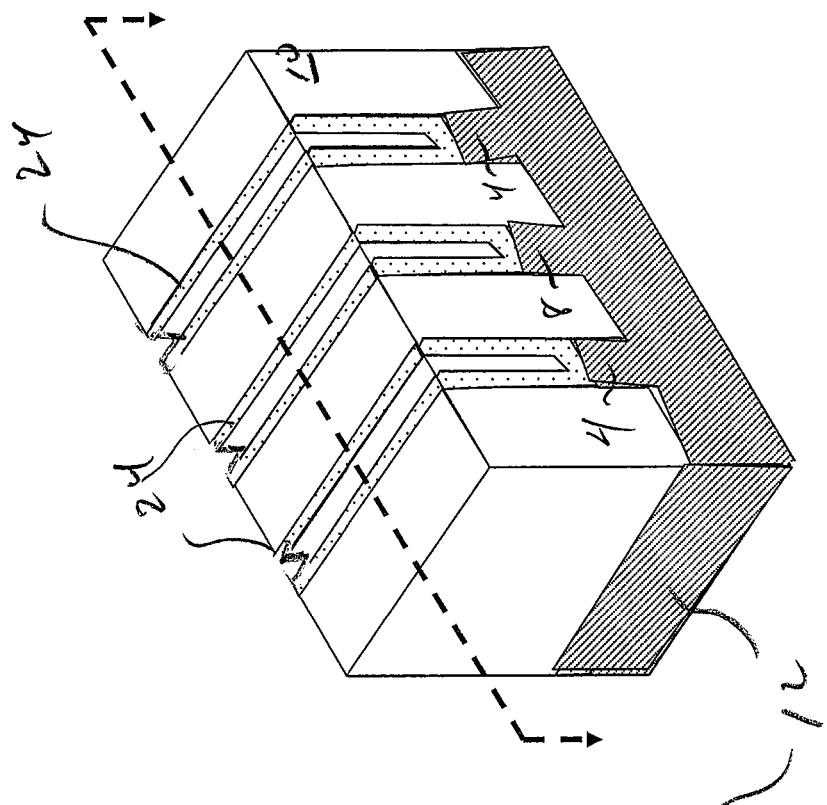
Figure 8B:
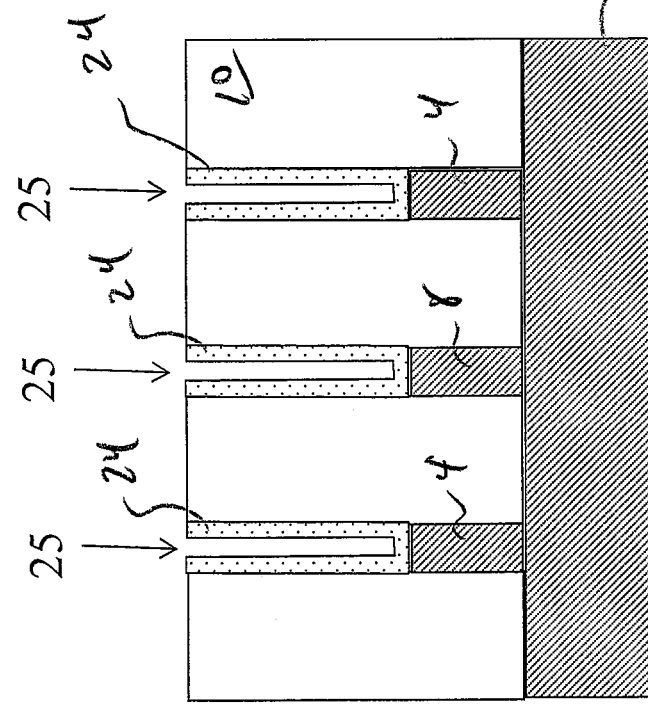

A second illustrative embodiment MOM capacitor is illustrated in perspective view in FIG. 8a and cross-sectional view in FIG. 8b. This second embodiment could also be employed using a SOI substrate, but is particularly advantageous for using a bulk substrate 12, as illustrated in FIGS. 8a and 8b. The second embodiment is manufactured using the similar processes illustrated in FIGS. 2a through 6b, albeit with a bulk substrate 12 rather than an SOI substrate. The manufacturing process diverges from that process for the first illustrative embodiment at this stage, however. In the second embodiment, recesses 23 (illustrated in FIGS. 6a and 6b) are partially, but not completely, filled with a liner dielectric layer 24. This is accomplished by forming the liner dielectric layer 24 on the bottom and sidewalls of the recesses in dielectric material 10. In this way, the subsequently formed electrodes are electrically isolated from bulk substrate 12, thus avoiding undesirable current paths through the substrate.

In an illustrative embodiment, recesses 23 have a width of from about 5 to about 30 nm, corresponding to the thickness of fin structures 4, 8. Liner dielectric material 24 may comprise silicon oxide, a high-k dielectric comprising a metal oxide. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. Liner material 24 is formed to a thickness of from about 5 nm to about 15 nm, as an example, on the sidewalls and bottom of the recess. Liner dielectric material 24 can be formed in recesses 23 by, e.g., thermal oxidation for a silicon oxide, or a CVD or similar process for a high-k dielectric.

Figures 9A, 9B:
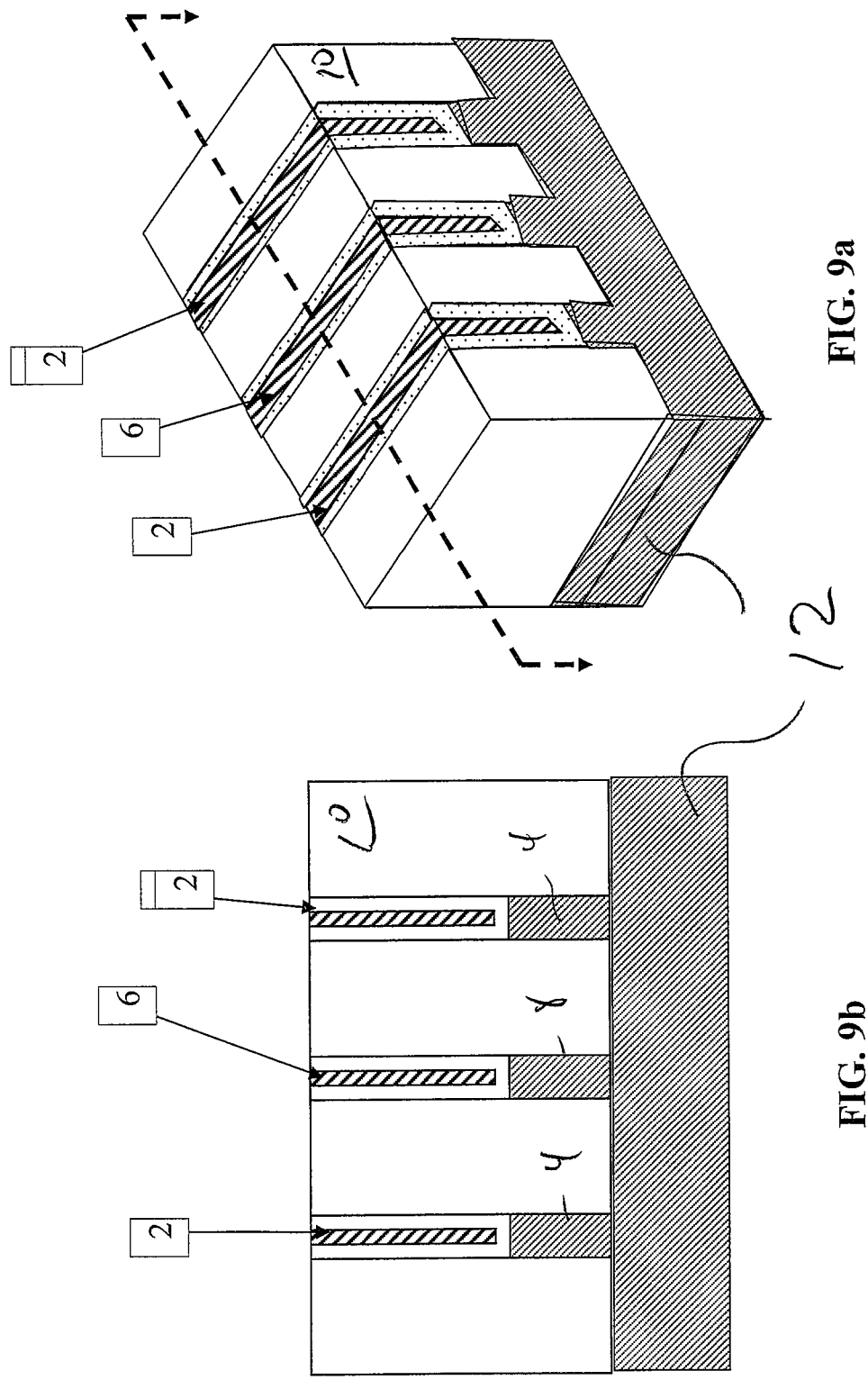

Because liner dielectric material 24 only partially fills recesses 23, recesses 25 remain after formation of liner dielectric material 24, as best illustrated in FIG. 8b. These recesses are thin filled with a conductive material, as illustrated in FIGS. 9a (perspective view) and 9b (cross-sectional view), thus forming first electrode 2 and second electrode 6. Illustrative materials and processes for forming electrodes 2 and 6 were discussed above with reference to FIGS. 7a and 7b, and hence are not repeated herein for the sake of brevity and clarity.

An advantageous feature of the embodiment illustrated in FIGS. 9a and 9b is the introduction of the additional dielectric material, i.e. liner dielectric material 24, allows for one to better engineer the capacitance value of the resulting MOM structure, by careful design of the material and thickness of liner dielectric material 24. Other advantageous features include the ability to form capacitors and transistors using the same process steps.

Figure 10A:
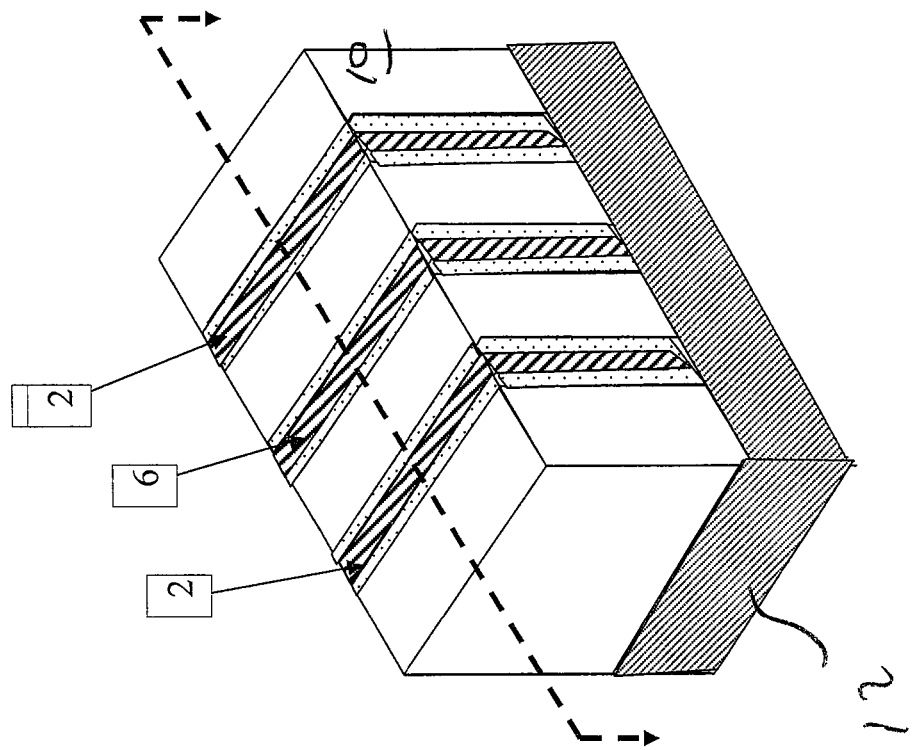
FIGS. 10a and 10b illustrate perspective view and cross-sectional view of an illustrative embodiment MOM capacitor structure.
Figure 10B:
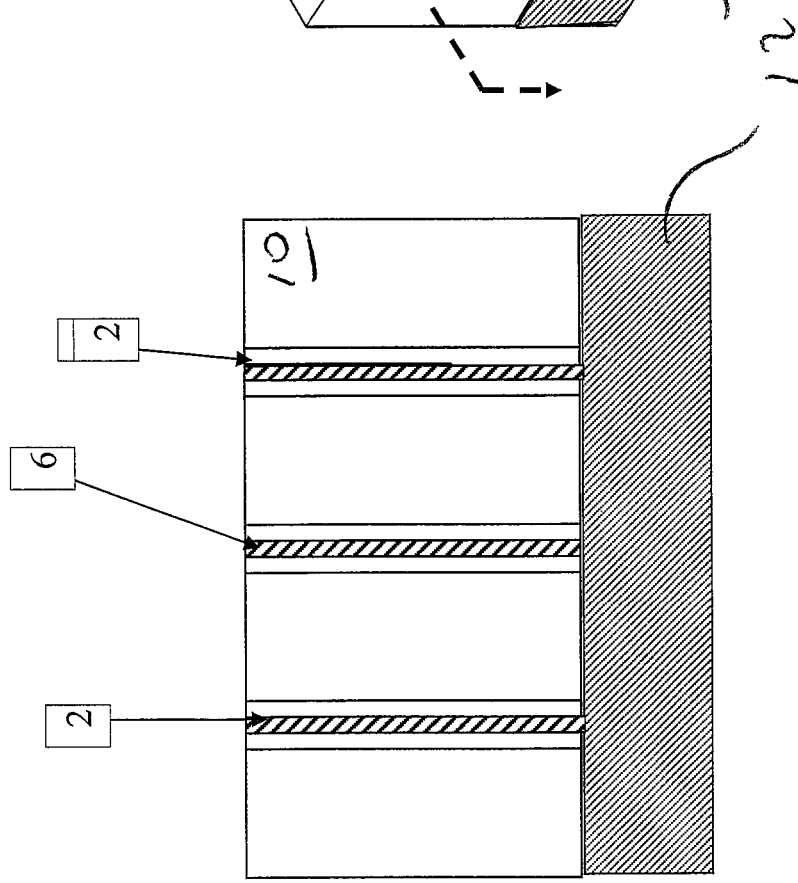

Yet another embodiment is illustrated in FIGS. 10*a* and 10*b*. This embodiment is similar to that illustrated in FIGS. 8*a*/8*b* and 9*a*/9*b*, except that in this embodiment fins 4 and 8 are removed completely, allowing recesses 23 to extend to the surface of substrate 12. Liner dielectric is formed on the sidewalls and bottoms of recesses 23, leaving recesses 25 within, which are in turn filled with conductive material to form electrodes 2 and 6, as shown in FIG. 10. By removing the fins 4, 8, the capacitor plates formed by electrodes 2, 6 are deeper and hence provide additional capacitive value.

What is claimed is:

1. A method of forming an integrated circuit comprising:
    forming on a substrate a dielectric layer having a first semiconductor fin therein and a second semiconductor fin therein;
    removing a top portion of the first semiconductor fin to form a first recess in the dielectric layer and removing a top portion of the second semiconductor fin to form a second recess in the dielectric layer; and
    forming a first electrode in the first recess above the first semiconductor fin and a second electrode physically isolated from the first electrode in the second recess above the second semiconductor fin, the first electrode and the second electrode comprising electrodes of a MOM capacitor, wherein no portions of the first electrode and the second electrode are disposed on sidewalls of the first semiconductor fin and the second semiconductor fin.

2. The method of claim 1 wherein the step of forming on the substrate the dielectric layer having the first semiconductor fin therein and the second semiconductor fin therein includes:
    forming a semiconductor layer on the substrate;
    patterning the semiconductor layer to form the first semiconductor fin and the second semiconductor fin;
    blanket depositing the dielectric layer over the substrate and the first and second semiconductor fins; and
    planarizing the dielectric layer to be level with respective top surfaces of the first and second semiconductor fins.

3. The method of claim 1 wherein the step of forming on the substrate the dielectric layer having the first semiconductor fin therein and the second semiconductor fin therein includes:
    forming the dielectric layer on the substrate;
    patterning the dielectric layer to form a first hole therein and a second hole therein; and
    epitaxially growing the first semiconductor fin in the first hole and epitaxially growing the second semiconductor fin in the second hole.

4. The method of claim 1 further comprising forming a liner dielectric in the first recess before forming the first electrode and forming a second liner dielectric in the second recess before forming the second electrode.

5. The method of claim 1 wherein removing the top portion of the first semiconductor fin to form the first recess in the dielectric layer and removing the top portion of the second semiconductor fin to form the second recess in the dielectric layer includes exposing the first semiconductor fin and the second semiconductor fin to at least one of HBr and $Cl_2$.

6. The method of claim 1 wherein the step of forming the first electrode in the first recess above the first semiconductor fin and the second electrode in the second recess above the second semiconductor fin includes depositing within the first and second recesses, respectively, a material selected from the group consisting essentially of a metal, a metal alloy, a conductive ceramic, a silicide, a doped semiconductor, and combinations thereof.

7. The method of claim 1 further comprising forming a third semiconductor fin in a third hole in the dielectric layer;
    forming a third electrode above the third semiconductor fin; and
    electrically connecting the first and third electrodes.

8. The method of claim 2 further comprising:
    forming a finFET fin simultaneously with forming the first semiconductor fin and the second semiconductor fin.

9. The method of claim 1, wherein the first semiconductor fin and the second semiconductor fin have an original height, and wherein the step of removing the top portions of the first semiconductor fin and the second semiconductor fin comprises etching back the first semiconductor fin and the second semiconductor fin to a recessed height of about 25% to about 80% of the original height.

10. A method of forming an integrated circuit comprising:
    forming a MOM capacitor having a first electrode formed atop a first semiconductor fin, a second electrode formed atop a second semiconductor fin, and a capacitor dielectric interjacent the first and second semiconductor fins, wherein a surface of the first electrode facing away from the first semiconductor fin and a surface of the second electrode facing away from the second semiconductor fin are coplanar with or at a level below a surface of the capacitor dielectric facing away from the first and second semiconductor fins; and
    forming a finFET device having source and drain regions formed in a third semiconductor fin, wherein the third semiconductor fin is formed simultaneously with the first and second semiconductor fins.

11. The method of claim 10 further comprising:
    performing a chemical mechanical polish (CMP) step on the capacitor dielectric.

12. The method of claim 10 further comprising etching back top surfaces of the first and second semiconductor fins to form respective first and second recesses in the capacitor dielectric.

13. The method of claim 12 further comprising forming a liner dielectric layer on sidewalls of the first and second recesses, respectively.

14. A method of forming an integrated circuit comprising:
    forming a first fin and a second fin on a semiconductor substrate;
    forming a dielectric on the semiconductor substrate, wherein the dielectric has a substantially planar top surface and surrounds the first fin and second fin, respectively, on at least two sides of the first fin and second fin, respectively,
    recessing the first fin and the second fin to have a top surface, respectively, below the top surface of the dielectric, thus forming a first recess and a second recess;
    partially filling the first recess and second recess, respectively, with a liner, thus forming a third recess and a fourth recess; and
    forming a first capacitor electrode in the third recess and a second capacitor electrode in the fourth recess, wherein no portion of the first capacitor electrode is disposed outside the third recess, and wherein no portion of the second capacitor electrode is disposed outside the fourth recess.

15. The method of claim 14, wherein the step of forming the first fin and the second fin on the semiconductor substrate comprises etching a top surface of the semiconductor substrate to form the fins.

16. The method of claim 14, wherein the dielectric is formed on the semiconductor substrate after forming the first fin and second fin.

17. The method of claim 14, further comprising:
    forming a third fin on the semiconductor substrate simultaneously with forming the first fin and second fin;
    forming a source region and a drain region in the third fin; and
    forming a gate electrode on the third fin.

18. The method of claim 14, further comprising:
    planarizing the top surface of the dielectric to be substantially co-planar with the top surfaces of the first fin and the second fin, respectively, before the step of recessing the first fin and second fin.

19. The method of claim 14, wherein the first fin and the second fin have an original height, and the step of recessing the first fin and the second fin comprises etching back the first fin and the second fin to a recessed height of about 25% to about 80% of the original height.

* * * * *